United States Patent [19]

Moon

[11] Patent Number: 5,492,477

[45] Date of Patent: Feb. 20, 1996

[54] MINIATURE LAMP HOLDER

[76] Inventor: Sam H. Moon, 2-1501 Shindong-ah Apartment, 988-1 Bangbae 3-dong, Seocho-ku, Seoul 137-063, Rep. of Korea

[21] Appl. No.: 191,432

[22] Filed: Feb. 3, 1994

[30] Foreign Application Priority Data

Feb. 3, 1993 [KR] Rep. of Korea .............................. 1346

[51] Int. Cl.$^6$ ...................................................... H01R 9/09
[52] U.S. Cl. ............................................ 439/57; 439/619
[58] Field of Search .................................. 439/56, 57, 58, 439/356, 611, 619, 558, 541

[56] References Cited

U.S. PATENT DOCUMENTS

| | | | |
|---|---|---|---|
| 3,555,341 | 1/1971 | Curtis ..................................... | 439/57 X |
| 3,859,554 | 1/1975 | Preziosi et al. ........................ | 439/57 X |
| 4,152,622 | 5/1979 | Fitzgerald ............................. | 439/56 X |
| 4,593,958 | 6/1986 | Baba ..................................... | 439/57 X |
| 5,160,277 | 11/1992 | Fitzgerald et al. ..................... | 439/56 X |

FOREIGN PATENT DOCUMENTS 1517110  3/1968  France .

Primary Examiner—Kheim Nguyen
Attorney, Agent, or Firm—Staas & Halsey

[57] ABSTRACT

Miniature lamp holder includes a cylindrical body having a central bore configured to receive a lamp, a pair of connectors located in the body to connect wires of the lamp with an electrical circuit, and a cap snapped into a bottom of the body. The body has a flange with a pair of diametrically disposed recesses in a top side thereof on an outer diameter. A pair of retaining projections extend upwardly from the top side of the flange and are formed axially of the body for engaging the miniature lamp holder in a circuit board aperture. A pair of cut-outs is formed axially of the cylindrical body over the pair of recesses. A pair of rails with a channel at a mid-section thereof extends downwardly from a bottom side of the flange. The connectors have a bent section at an upper end thereof, a "V"-shaped hooked section at a lower end thereof, and a dimple in the hooked section for accommodating the lamp. The cap has a central projection for pushing the wires outwardly to tightly connect the wires with the connectors, and a pair of diametrically disposed snaps.

1 Claim, 4 Drawing Sheets

MINIATURE LAMP HOLDER

FIELD OF THE INVENTION

This invention relates to a miniature lamp holder, in particular an improved lamp holder which is easily mounted in an aperture in a printed circuit board and is easy to replace.

DESCRIPTION OF THE PRIOR ART

Lamp holders are used, most generally, with lamps and permit them to be secured to boards or panels.

In the past it has been known to mount the lamp or LED glass or like shells in a resilient plastic holder which is then snapped into an aperture in a board.

When it desired to replace a lamp it has been necessary to remove the holder from the board, and then to remove the lamp from the holder, the reverse procedure being followed to install a new lamp. This is time-consuming and a nuisance. Typically the holder has to be removed from the front of the panel, but the wires for the lamp are under the board, and this requires wires that are otherwise unnecessarily long to permit the holder with a lamp therein to be lifted from the board far enough so that the lamp can be released from the holder.

U.S. Pat. No. 4,419,722 and U.S. Pat. No. 4,507,718 describe a light emitting diode holder made of resilient plastic material that is molded into a one-piece cylindrical shaped body having a central bore configured to receive a light emitting diode. A flange is formed at one end of the cylindrical body to hold the diode holder about an aperture in a board. A pair of resilient legs having snap-over retaining shoulders is formed axially of the cylindrical body for engaging the board on the opposite sides of the flange to secure the diode holder in the aperture. A second pair of longer leg portions is formed axially of the body and includes snap-over shoulders for receiving the flange at the base of the light emitting diode to secure the light emitting diode in the holder.

In using the holder of the above inventions, it has been found that an axial inwardly directed force on the LED causes the longer legs to lose their gripping force on the LED and the LED is then dislodged from the LED holder.

Accordingly said holder doesn't have the connecting means between the wires and an electric circuit for energizing the lamp. This invention is directed to an improvement to correct this problem.

SUMMARY OF THE INVENTION

An object of this invention is to provide a miniature lamp holder which can be installed in an aperture in boards, and with which the lamp can be assembled.

Another object of this invention is to provide a miniature lamp holder having means for connecting wires of lamps with an electrical circuit on a board.

Another object of this invention is to provide a miniature lamp holder with which a lamp can be assembled more tightly.

The miniature lamp holder of the invention includes a cylindrical body having a central bore configured to receive a lamp, and a pair of conductive means sited in said body to connect wires of the lamp with an electrical circuit, and a cap snapped into the bottom of the body.

The cylindrical body has a flange with a pair of diametically disposed recesses in a top side thereof on an outer diameter. A pair of retaining projections upwardly extending from the top side of the flange are formed axially of the cylindrical body for engaging the board on the top side of a flange to secure the miniature lamp holder in the aperture. A pair of cut-outs is formed axially of the cylindrical body over the pair of recesses. A pair of rails with a channel at the mid-section thereof downwardly extends from a bottom side of the flange.

The conductive means disposed in the central bore of the cylindrical body has a bending section at an upper end thereof, a "V"-shaped hooked section at lower end, and a dimple in the hooked section for accommodating the lamp.

The cap has a central projection for pushing the metallic wires outwardly to tightly connect the wires with the conductive means and a pair of diametrically disposed snaps.

BRIEF DESCRIPTION OF THE DRAWINGS

The invention will be described in greater detail with reference to the drawings in which.

DETAILED DESCRIPTION OF THE INVENTION

Figure 1:
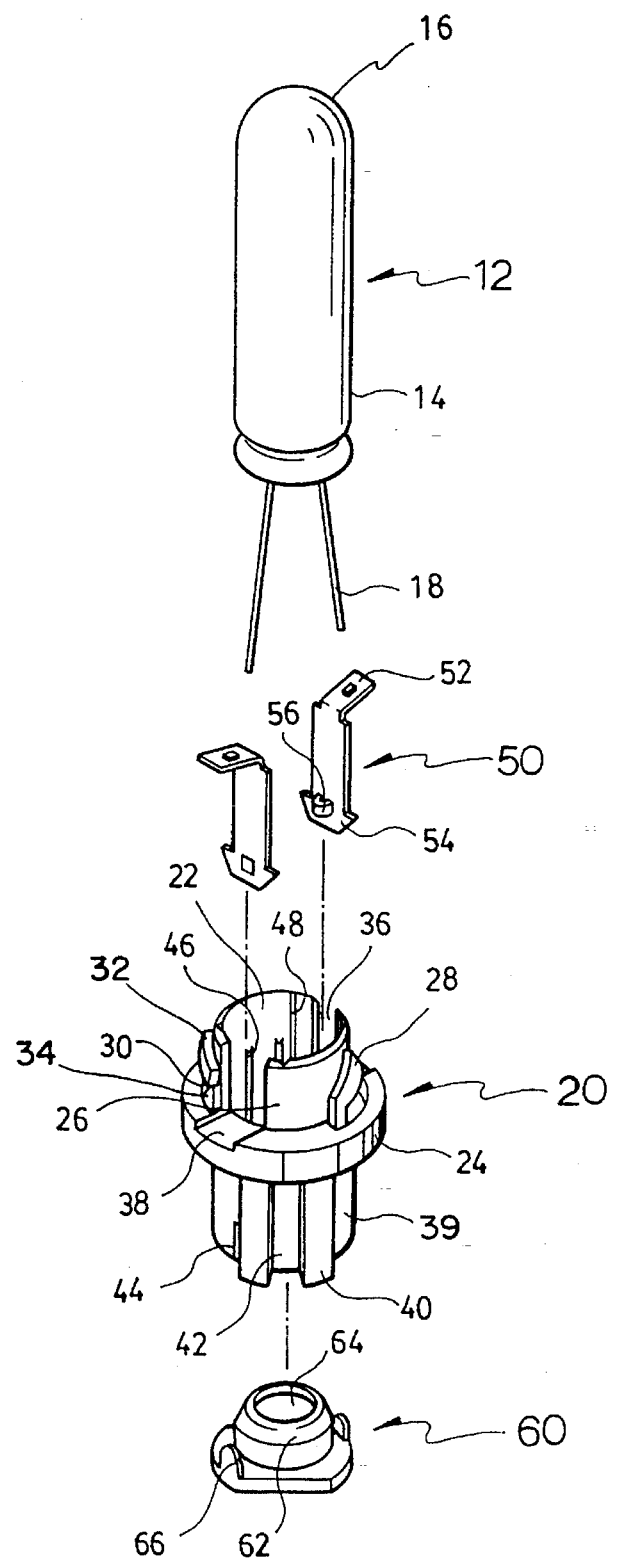
FIG. 1 is an exploded perspective view of a miniature lamp holder in accordance with the present invention and having a lamp to be mounted therein.
Figure 2:
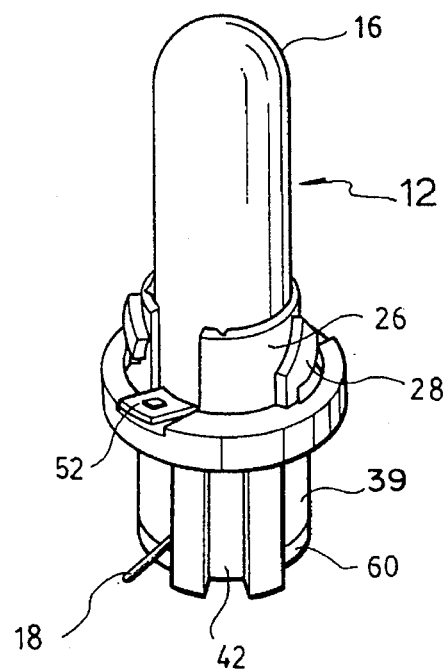
FIG. 2 is a perspctive view of an assembly of the miniature lamp holder and the lamp.
Figure 3:
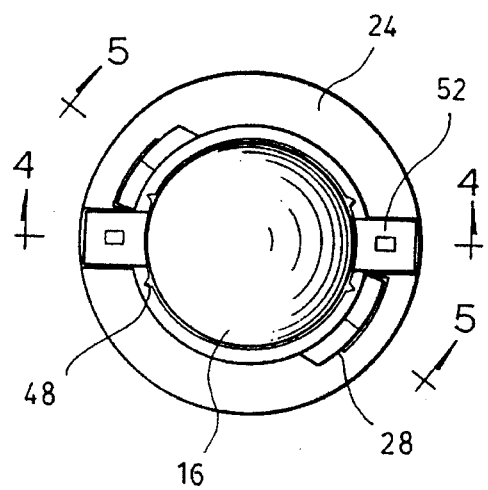
FIG. 3 is a top view of the structure of FIG. 2.
Figure 4:
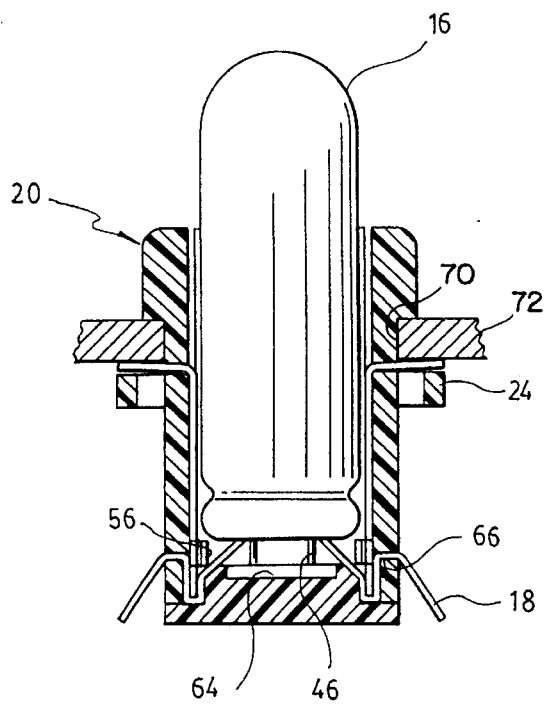
FIG. 4 is an axial sectional view taken along 4—4 in FIG. 3.
Figure 5:
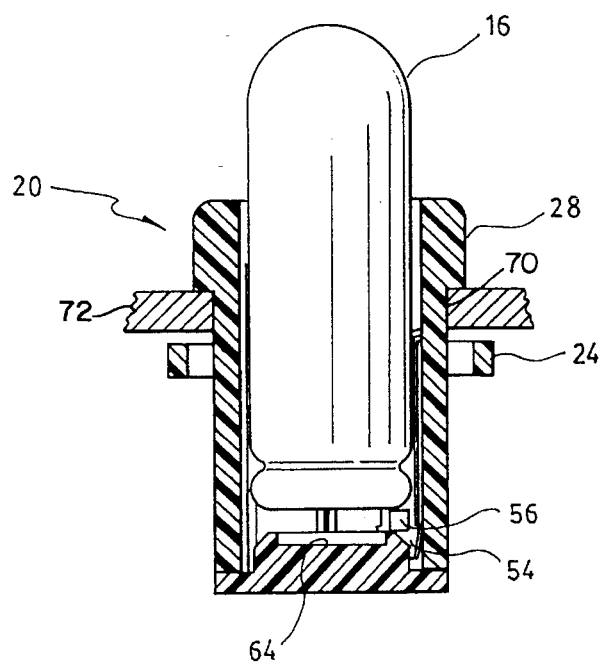
FIG. 5 is an axial sectional view taken along 5—5 in FIG. 3.
Figure 6:
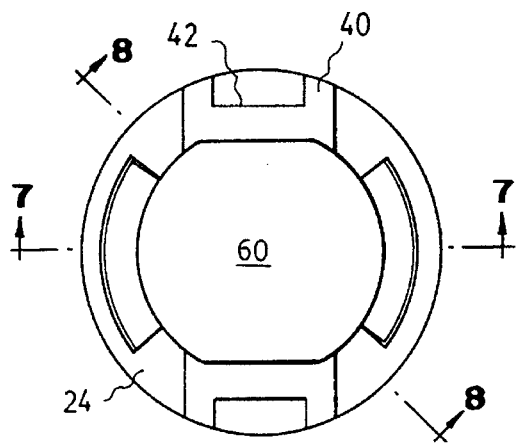
FIG. 6 is an underside view of the holder without the lamp mounted therein.
Figure 7:
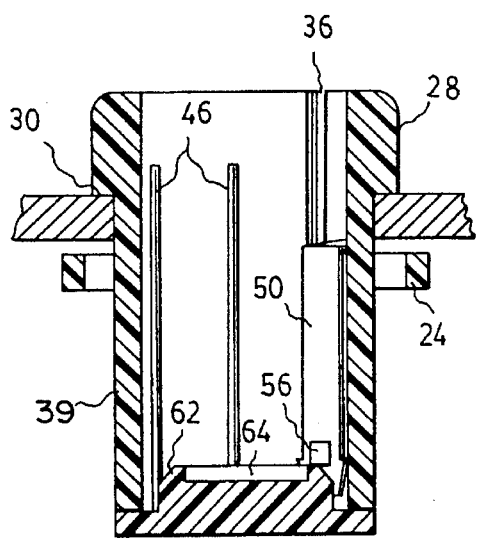
FIG. 7 is an axial sectional view taken along the line 7—7 in FIG. 6.
Figure 8:
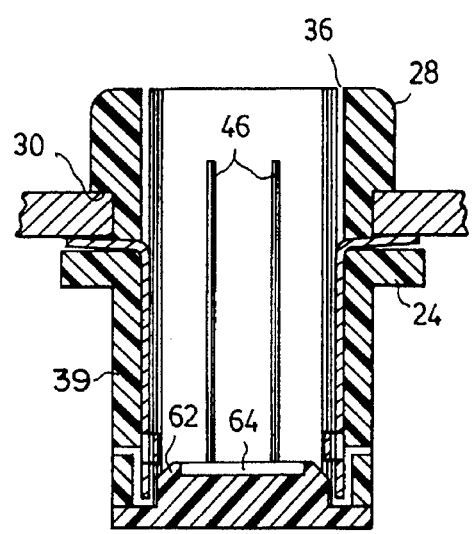
FIG. 8 is an axial sectional view taken along the line 8—8 in FIG. 6.

With referance to the drawings now in greater particularity, attention first is directed to a lamp 12.

The lamp 12 includes a cylindrical body 14 having a spherical upper end 16. As noted previously, the part seen is actually a casing or housing generally made of glass. A pair of metallic wires or leads 18 extends from the base of the structure, the structure hereinafter being refered to simply as a lamp.

This invention includes a lamp holder 20, a pair of connectors 50, and a cap 60.

The holder 20 is preferably molded of resilient plastic material and shaped as a one-piece cylindrical body having a central bore 22 to receive the lamp 12.

The cylindrical body has a flange 24 at about a middle section of an outer surface. An outer diameter of the flange 24 is sufficiently great as to extend beyond an aperture 70 in a board 72 in which the holder 20 is to be mounted. An upper section 26 of the holder 24 has an outer diameter of proper dimension to fit through the aperture 70.

The outer surface of the upper section 26 has a pair of retaining projections 28 extending upwardly from the flange 24. Each retaining projection 28 has a wedge-shaped head to guide the holder 20 during insertion of the upper section 26 through the aperture 70. A rectangular notch 30 is provided in a side of each projection 28 and is defined by upper chamfered surface 32 and a hole 34 formed in the top side of flange 24.

The upper section 26 is further provided with a pair of cut-outs 36 extending upwardly from the top side of the flange 24 to seat the connectors 50. Also a pair of recesses 38 is formed at a base of the cut-outs 36.

A lower section 39 of the body 20 has a pair of rails 40 extending downwardly from the flange 24. Each rail 40 has a channel 42 at a mid-section thereof. The lower section 39 is further provided with a pair of cut-outs 44 extending upwardly from the bottom of the body 20 to seat the wires 18.

Four axially extending crush ribs 46 are formed on the inner surface along the body 20.

The crush ribs 46 serve to accommodate variations in the outer diameter size of lamps and to hold lamp 12 in direct alignment with the annular body 20. And also on the inner surface of the body four grooves 48 are provided, which axially extend from the top of the body for insertion of the connectors 50 into the central bore 22.

The pair of connectors 50 disposed in the central bore 22 of the cylindrical body 20 have a narrow bending section 52 at an upper end, a "V"-shaped hooked section 54 at a lower end, and a dimple 56 in the hooked section 54 for accommodating the lamp 12.

Each connector 50 is inserted through the grooves 48 and located in the central bore 22. Then each bending section 52 is disposed at an angle upwardly relative to the surface of the recess 38.

The cap 60 snaps in the bottom of the central bore 20 and has a spherical projection 62 with a central flat top 64 and a pair of snap fasteners 66. The spherical projection 62 serves to push the metallic wires 18 outwardly for tightly connecting the wires 18 with the connectors 50 and to support the lamp 12.

The specific example of the invention as herein shown and described is for illustrative purposes only.

Various changes in structure will no doubt occur to those skilled in the art, and will be understood as forming a part of the present invention insofar as they fall within the spirit and scope of the appended claims.

What is claimed is:

1. A miniature lamp holder to be received in an aperature of a printed circuit board, comprising:

a cylindrical body having a central bore configured to receive a lamp, a flange with a pair of diametrically disposed recesses in a top side of the flange, a pair of retaining projections extending upwardly from said flange for engaging said board above said flange, a pair of cut-outs axially extending from said recesses, and a pair of rails with a channel at a mid-section thereof extending downwardly from the flange;

a pair of connectors disposed in said central bore for connecting metallic wires of a lamp with an electrical circuit of the board, said connectors having a bent section at an upper end thereof, a V-shaped hooked section at a lower end thereof, and a dimple in said hooked section for accommodating the lamp; and a cap having a spherical projection and a pair of diametrically disposed snap fasteners, snapping in a bottom of said central bore for receiving a lower end of the connectors, and the wires in a bent configuration, and tightly holding the wires against and around the lower end of the connectors, and fixing said lamp in the holder.

* * * * *